United States Patent

Earl

(10) Patent No.: US 8,760,210 B1
(45) Date of Patent: Jun. 24, 2014

(54) MULTIPLE SAMPLES WITH DELAY IN OVERSAMPLING IN PHASE

(71) Applicant: Cadence Design Systems, Inc., San Jose, CA (US)

(72) Inventor: Jeffrey S. Earl, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/626,787

(22) Filed: Sep. 25, 2012

(51) Int. Cl.
*H03H 11/26* (2006.01)

(52) U.S. Cl.
USPC .......................... 327/269; 327/272; 327/275

(58) Field of Classification Search
USPC .......................................... 327/269, 272, 275
See application file for complete search history.

(56) References Cited

U.S. PATENT DOCUMENTS

| 6,150,863 | A  | * | 11/2000 | Conn et al. | 327/270 |
| 7,279,944 | B2 | * | 10/2007 | Lu          | 327/152 |

* cited by examiner

*Primary Examiner* — John Poos
(74) *Attorney, Agent, or Firm* — Sawyer Law Group, P.C.

(57) ABSTRACT

A method and system in accordance with the present invention provides for a method and circuit for oversampling using a delay element in which input clock signals and input data signals are affected by phase and time delays to provide for the circuit generating samples providing a greater granularity of detail over a period, thereby reducing error probabilities.

22 Claims, 4 Drawing Sheets

MULTIPLE SAMPLES WITH DELAY IN OVERSAMPLING IN PHASE

FIELD OF THE INVENTION

The present invention relates generally to signal processing, and more particularly, to methods and circuits for oversampling a signal or series of signals in an integrated circuit.

BACKGROUND OF THE INVENTION

In signal processing, various timing information, such as frequency, phase, or skew, is often gathered from a signal or series of signals having a sampling frequency higher than the bandwidth or frequency of the sampled signal(s) when oversampling.

By oversampling the incoming data stream, transition locations may be determined, valid data bits extracted and analyzed from the oversampled data, and bit boundaries identified for selecting preferred samples for bit recovery. Operationally, in oversampling, one method is recognized to first provide a common data stream to a plurality of flip-flops, generate multiple phases of a base clock, and provide each of the clock phases to a different flip-flop of the plurality of flip-flops. Oversampling improves the frequency at which the base clock alone would have sampled the data signal as the frequency of the data signal sampled is increased over the base clock frequency alone by the approach. In some oversampling approaches, an oversampling factor is applied which is the number of clock phases used to initiate the oversampling.

However, oversampling, particularly at higher oversampling rates, typically requires the use of multiple clock phases that often consume several digital clock managers (DCMs) and global clock resources. The approach may result in an inefficient use of resources such as where using multiple DCMs may create jitter in output thereby decreasing the precision of the sampling points, for instance. The approach may also create the need for additional clocks thereby creating a complex system requiring complicated data routing and additional system resource demands. Similarly, there are disadvantages such as increase of chip size, increase of current consumption and increase of cost in such traditional approaches.

Similarly, when attempting to increase the number of samples during a signal period for an available input signal, often an approach may include adding more flip-flops and more clock signals. A circuit comprised as such would then oversample an incoming serial data stream (i.e., input signal), evaluating data transition locations such as rising and falling waveforms, and extract data bits from the oversampled data following processing. After which, the oversampled data can then be analyzed to locate bit boundaries. However, while the addition of such may increase the number of samples, it also additionally provides for most cost, complexity and routing in order to maintain timed spacing, where such complexity does not necessarily ensure improved accuracy in all cases.

What is desired is an approach that increases the granularity of sampling within a single clock cycle without increasing the complexity of the addition of complicated resources and routings, thereby traversing the shortcomings of the typical approach and reducing error.

As used herein the terms device, apparatus, system, etc. are intended to be inclusive, interchangeable, and/or synonymous with one another and other similar arrangements and equipment for purposes of the present invention though one will recognize that functionally each may have unique characteristics, functions and/or operations which may be specific to its individual capabilities and/or deployment.

Accordingly, there is a need for an improved method of and circuit for oversampling a signal in an integrated circuit without added complexity.

SUMMARY OF THE INVENTION

A method and system in accordance with the present invention fulfills these needs and has been developed in response to the present state of the art, and in particular, in response to the problems and needs in the art that have not yet been fully solved by currently available technologies.

In one aspect, a method of oversampling a signal in an integrated circuit having a delay element is disclosed. In a particular aspect, the method provides for: receiving at least one reference clock signal; generating from the delay element at least one phase-delayed clock signal for each clock; receiving an input signal; generating from a second delay element at least one time-delayed input signal; and, generating a plurality of output signals for a received reference clock signal, received phase-delayed clock signal, received input signal or received time-delayed input signal.

In another aspect, a circuit having a delay element for oversampling a signal is disclosed. In a particular aspect, the circuit provides for: at least one data input capable of receiving an input data signal; at least one signal input capable of receiving a clock reference signal; a first register coupled to the delay circuit for generating a first sampling of data; and a second register for generating a second sampling of data coupled to receive the clock reference signal and the input data signal. Preferably, the delay element of the circuit further provides for a delay circuit for generating delays in relation to the received clock reference signal and the received input data signal.

Further embodiments, forms, objects, features, advantages, aspects, and benefits of the present application shall become apparent from the detailed description and drawings included herein.

DETAILED DESCRIPTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
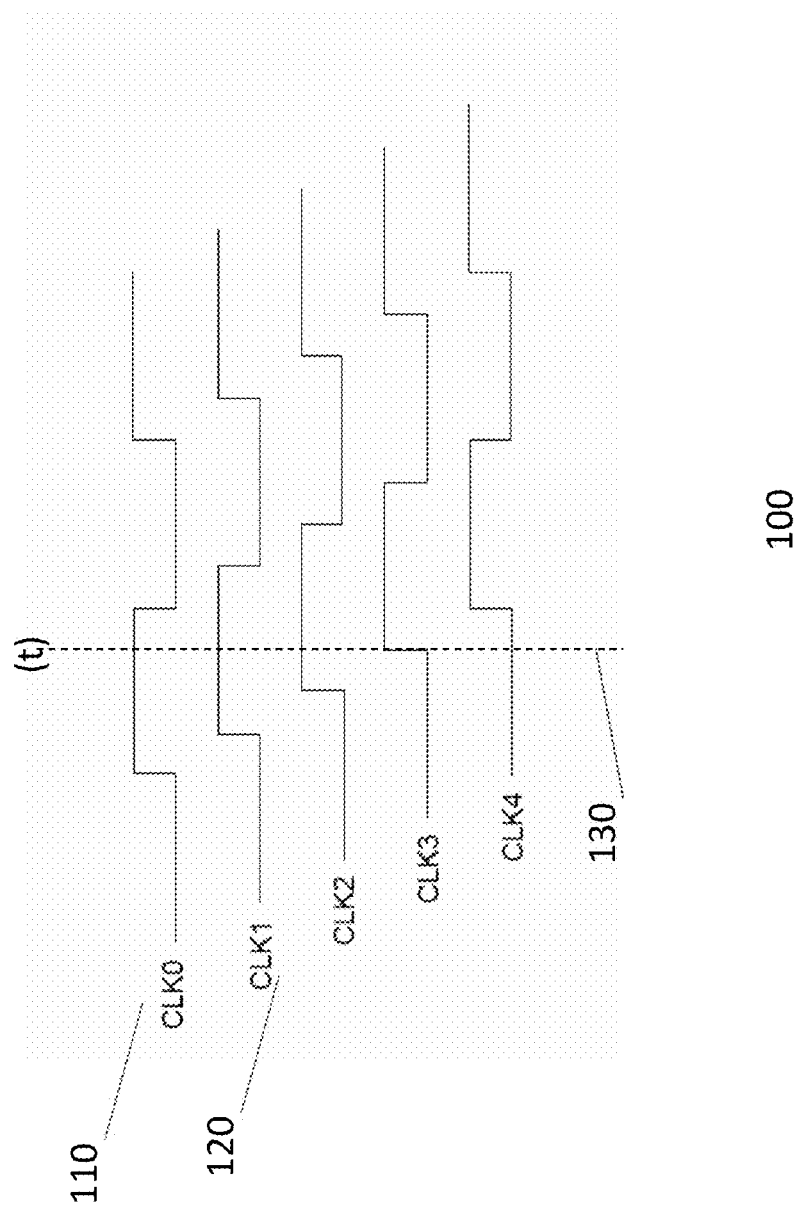
FIG. 1 sets forth a diagram of clock signals in accordance with the present invention.

FIG. 1 sets forth a diagram 100 of clock signals in accordance with the present invention. CLK0 is a reference clock signal 110 which presents a baseline clock signal for which other clock signals may have phase or time shifts in relation thereto. CLK1 is a non-reference clock signal 120 which is associated with a flip flop or register (i.e., a plurality of flip flops) and is shifted from the CLK0 in accordance with a predetermined value. Typically, a clock signal is of a different phase than that of the CLK0 reference signal and collectively, the clock signals are within a single cycle. Accordingly, a sample at a common relative time (130) across each of the clock signals of the FIG. 1 would identify a different signal sample for each clock signal in relation to the CLK0 and the relative time.

Figure 2:
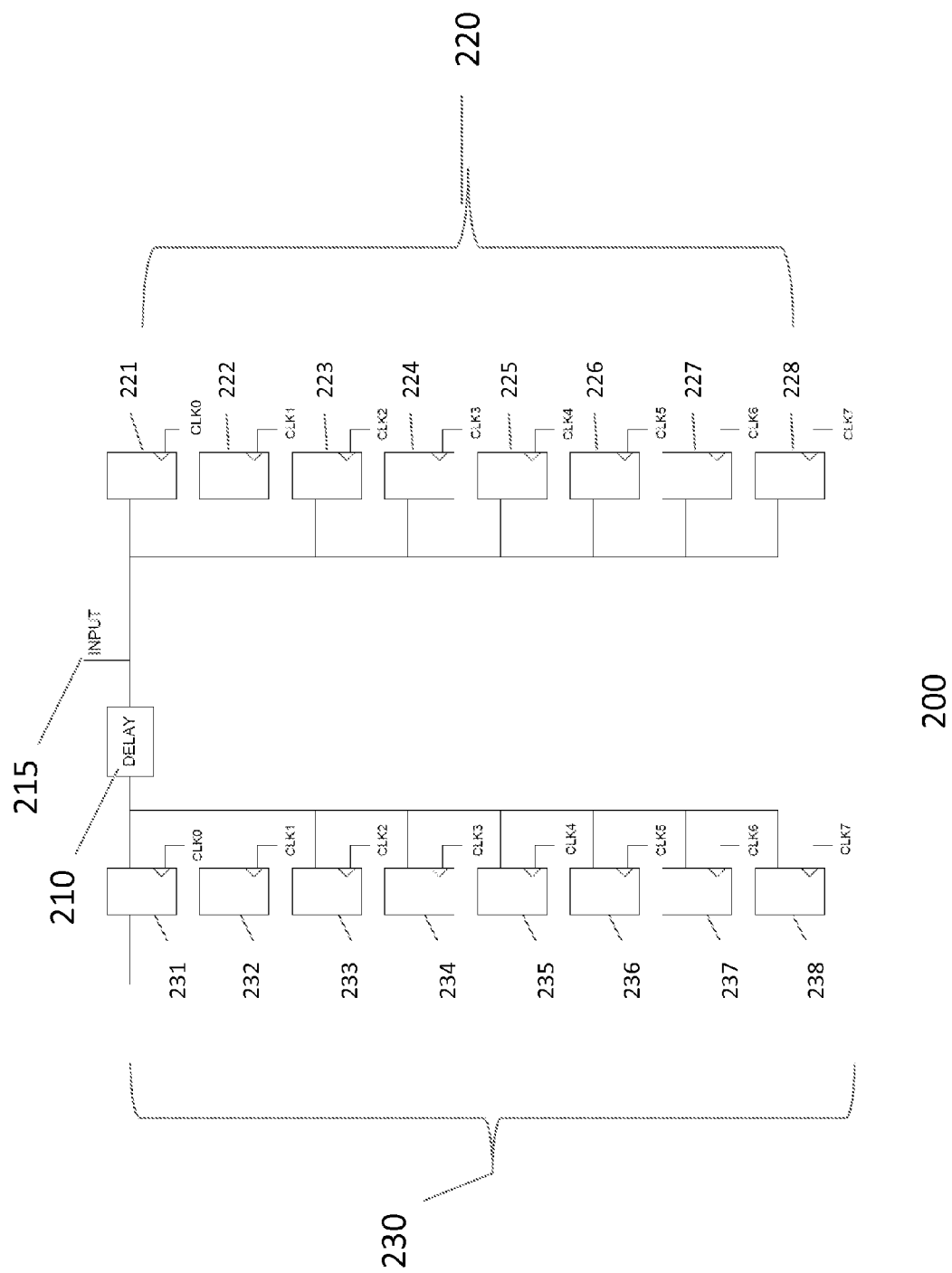
FIG. 2 presents a block diagram of a circuit embodiment of the present invention in which the circuit has a delay element; and, FIG. 3 presents a detail of the delay aspects for the clock signals of the present invention.

FIG. 2 presents a block diagram of a circuit embodiment 200 in which the circuit 200 has a delay element 210. Input data signals 215 are received across the circuit, where the input signals are provided to the non-delayed register of flip flops 220 (comprised of flip flops 221-228) and also provided to the delayed register of flip flops 230 (comprised of flip flops 231-238). The clock signals depicted in FIG. 2 include CLK0 through CLK7, though it will be appreciated that the present invention is not so limited to that which is depicted in any of the Figures herein. CLK0 is a reference clock signal and the remaining clock signals, CLK1 through CLK7, are phase shifted signals in relation to CLK0.

From FIG. 2, a data signal sourced from a DATA IN source (not shown) provides the Input signal 215 As the data of the Input signal is received by the delay element 210, the delay element generates time-shifted data signals to be processed by the register 230. Each flip flop of the register 230 acts upon the received delayed input signal data and provides a sample in relation to its respective clock signal, which may be phase shifted, and its received delayed input data signal, which may be time-shifted.

In a similar aspect, the data of the Input signal is received by the register 220 which does not have the intermediate delay element. Each flip flop of the register 220 acts upon the received input signal data and provides a sample in relation to its respective clock signal, which may be phase shifted, and the received input data signal, which is not time-shifted.

Figure 3:
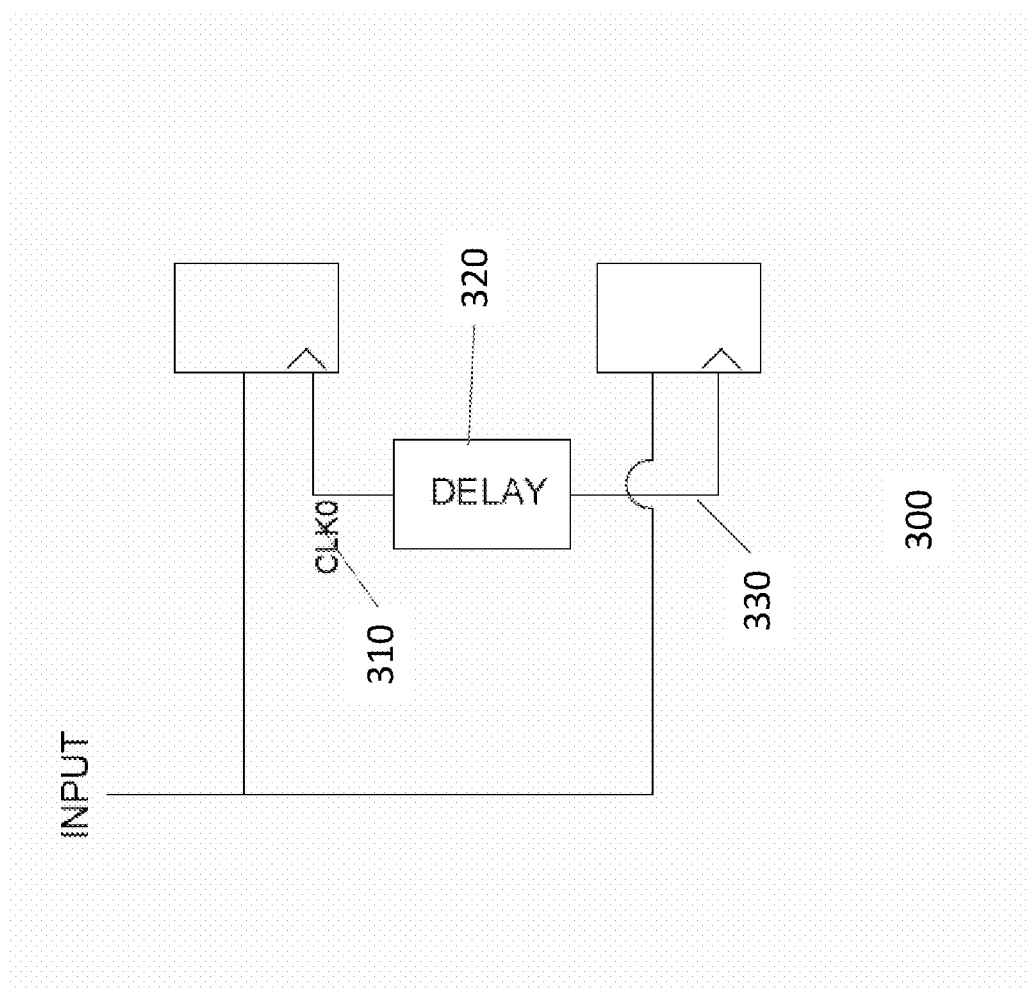

FIG. 3 presents a detail of the delay aspects for the clock signals 300 of the present invention. From FIG. 3, the CLK0 signal 310 is delayed by the Delay Element 320 to generate a delayed clock signal 330. The delay element 320 depicted in FIG. 3 may be applied for the present invention in one or more embodiments, and is one approach for providing a phase-shift delay for clock signals which are then provided to their respective flip flop.

In this manner, a method and system in accordance with the present invention provides for generating phase-shifted clock signals and time-delayed input signals which may then be acted upon by respective flip flops of designated registers to generate sample bits which provide for samples of increased granularity for the input signal over the sampling period.

For instance, returning to FIG. 2, in one operation the circuit has a delay element that is able to delay the input data signal to the delayed register 230 by a time-delay. Similarly, a second delay element is also adapted in the Figure to provide for a delay to the clock signal in relation to the reference clock signal by providing a phase delay. In this aspect, the present invention would then provide for samples generated from the delay register that reflected inputs combining both a time-shifted data signal and a phase-shifted clock signal; whereas samples generated from the register 220 would provide for samples generated that reflected the input data signal without intervention of the delay element and a phase-shifted clock signal.

In effect, from FIG. 2, the embodiment in this arrangement provides for 16× oversampling with sampling results that are generally evenly spaced in relation to the delays and inputs associated therewith. In so doing, a method and system in accordance with the present invention provides for having delay elements that affect time and phase such that it is more suited for generating sampling in relation to specific time and phase relationships without additional circuit complexity, thereby producing more accurate sampling.

Figure 4:
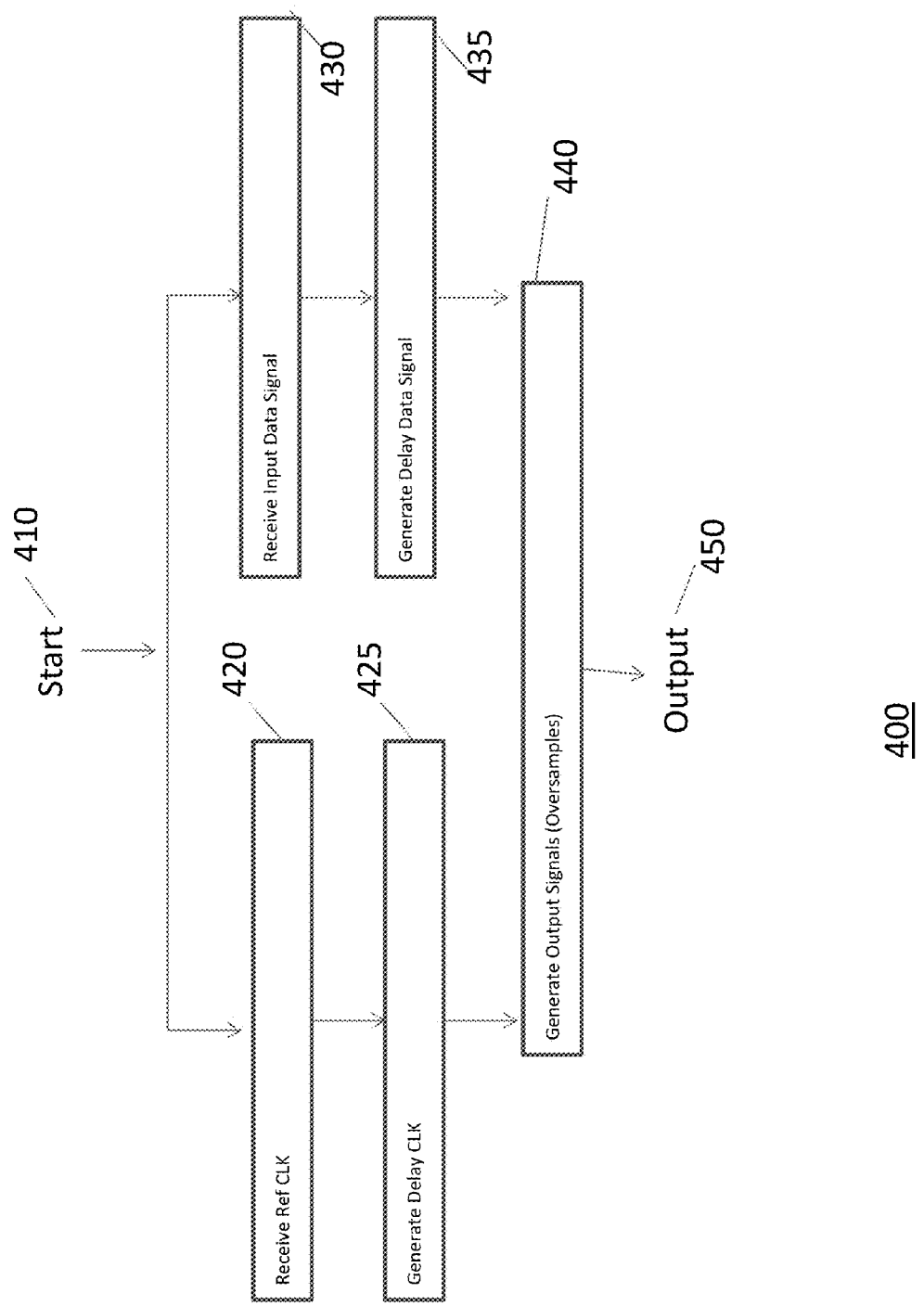
FIG. 4 provides an overview of the method of the present invention in accordance with one or more embodiments.

FIG. 4 provides an overview of a process 400 in accordance with one or more embodiments. From FIG. 4, the process 400 begins at a starting or instantiation point 410 and one of or both processes of receiving data (clock reference signal and input data signal) may occur concurrently, simultaneously or serially without affecting the operation of the process invention. At 420, the reference clock data is received. At 425, from the delay element receiving the reference clock data, at least one phase-delayed clock signal for each clock in relation to the reference clock signal is generated. At 430, the input data signal is received. At 435, from the delay element receiving the input data signal, at least one time-delayed input signal based upon the input signal is generated. The output of 425 and the output of 435 comprise the samples generated at 440 and may be further analyzed or assessed at output at 450. The samples generated at 440 includes those which, for each clock signal received, including a reference clock signal or a phase-delayed clock signal, and for each data signal received, including an input signal, and a time-delayed input signal, include a plurality of output signals generated in relation to both a clock signal and a data signal.

A method and system in accordance with the present invention provides for a method in which the plurality of output signals generated is phase-shifted and the phase-shifted output signals are generated by using or processing as inputs the associated clock signals and data signals. Sampling results are obtained by receiving combinations of a phase-delayed clock signal and a time-delayed input signal at each register for processing. The delay elements may be devices, circuits, software or similar, which may be integrated or separate in function and utility to achieve the objectives of the present invention.

Additionally, as there is no requirement for alignment of clocks in the present invention given the delay element, a conventional clock phase aligner (CPA) as is often necessitated is not required as in traditional approaches.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method of oversampling a signal in an integrated circuit having a delay element, the method comprising:
 receiving at least one reference clock signal; generating from the delay element at least one phase-delayed clock signal for each clock;
 receiving an input signal; generating from a second delay element at least one time-delayed input signal; and,
 generating a plurality of output signals for a received reference clock signal, received phase-delayed clock signal, received input signal or received time-delayed input signal, wherein the plurality of output signals generated is phase-shifted, wherein the plurality of phase-shifted output signals is generated by processing each clock signal and each data signal through a register.

2. The method of claim 1, wherein generating the at least one phase-delayed clock signal comprises generating a plurality of delayed clock signals having different phases in relation to one another.

3. The method of claim 1, wherein the delay element includes at least one or more delay elements responsive to providing delays in generating one or more phase-delayed clock signals and one or more time-delayed input signals.

4. The method of claim 3, wherein the delay element includes a first delay element responsive to providing delays in generating one or more phase-delayed clock signals and a second delay element responsive to providing delays in generating one or more time-delayed input signals.

5. The method of claim 1, wherein generating a plurality of phase-shifted output signals includes receiving combinations of a phase-delayed clock signal and a time-delayed input signal at a register.

6. The method of claim 5, wherein a register comprises a plurality of flip-flops.

7. The method of claim 1, wherein generating a plurality of phase-shifted output signals includes receiving combinations of a phase-delayed clock signal and a time-delayed input signal at one or more flip flops.

8. The method of claim 1, wherein each of the phase-shifted output signals are generally evenly spaced by shifted phase.

9. The method of claim 1, wherein each phase-delayed clock signal is generally evenly spaced from one another.

10. The method of claim 1, wherein each time-delayed input signal is generally evenly spaced from one another.

11. A circuit having a delay element for oversampling a signal, the circuit comprising:
   at least one data input capable of receiving an input data signal;
   at least one signal input capable of receiving a clock reference signal;
   the delay element comprising a delay circuit for generating delays in relation to the received clock reference signal and the received input data signal;
   a first register coupled to the delay circuit for generating a first sampling of data; and
   a second register for generating a second sampling of data coupled to receive the clock reference signal and the input data signal,
   wherein the first register comprises a first plurality of flip flops and the second register comprises a second plurality of flip flops.

12. The circuit of claim 11, wherein the number of flip flops in the first plurality of flip flops and the second plurality of flips flops is the same.

13. The circuit of claim 11, wherein the circuit is capable of generating at least one phase-delayed clock signal in relation to the clock reference signal and generating at least one time-delayed data signal in relation to the input data signal.

14. The circuit of claim 13, wherein the first register receives a plurality of first delay signals being at least a phase-delayed clock signal and a time-delayed data signal.

15. The circuit of claim 14, wherein the second register receives a clock signal and a data signal different that the plurality of first delay signals received by the first register.

16. The circuit of claim 11, wherein the first sampling of data and the second sampling of data are generally evenly spaced with respect to one or more of time and phase.

17. The circuit of claim 11, wherein the delay element comprises a plurality of delay circuits.

18. A method of oversampling a signal in an integrated circuit having a delay element, the method comprising:
   receiving at least one reference clock signal; generating from the delay element at least one phase-delayed clock signal for each clock;
   receiving an input signal; generating from a second delay element at least one time-delayed input signal; and,
   generating a plurality of output signals for a received reference clock signal, received phase-delayed clock signal, received input signal or received time-delayed input signal, wherein the plurality of output signals generated is phase-shifted, wherein the delay element includes at least one or more delay elements responsive to providing delays in generating one or more phase-delayed clock signals and one or more time-delayed input signals, wherein the delay element includes a first delay element responsive to providing delays in generating one or more phase-delayed clock signals and a second delay element responsive to providing delays in generating one or more time-delayed input signals.

19. A method of oversampling a signal in an integrated circuit having a delay element, the method comprising:
   receiving at least one reference clock signal; generating from the delay element at least one phase-delayed clock signal for each clock;
   receiving an input signal; generating from a second delay element at least one time-delayed input signal; and,
   generating a plurality of output signals for a received reference clock signal, received phase-delayed clock signal, received input signal or received time-delayed input signal, wherein the plurality of output signals generated is phase-shifted, wherein generating a plurality of phase-shifted output signals includes receiving combinations of a phase-delayed clock signal and a time-delayed input signal at a register, wherein a register comprises a plurality of flip-flops.

20. A method of oversampling a signal in an integrated circuit having a delay element, the method comprising:
   receiving at least one reference clock signal; generating from the delay element at least one phase-delayed clock signal for each clock;
   receiving an input signal; generating from a second delay element at least one time-delayed input signal; and,
   generating a plurality of output signals for a received reference clock signal, received phase-delayed clock signal, received input signal or received time-delayed input signal, wherein the plurality of output signals generated is phase-shifted, wherein generating a plurality of phase-shifted output signals includes receiving combinations of a phase-delayed clock signal and a time-delayed input signal at one or more flip flops.

21. A circuit having a delay element for oversampling a signal, the circuit comprising:
   at least one data input capable of receiving an input data signal;
   at least one signal input capable of receiving a clock reference signal;
   the delay element comprising a delay circuit for generating delays in relation to the received clock reference signal and the received input data signal;
   a first register coupled to the delay circuit for generating a first sampling of data; and
   a second register for generating a second sampling of data coupled to receive the clock reference signal and the input data signal, wherein the first sampling of data and the second sampling of data are generally evenly spaced with respect to one or more of time and phase.

22. A circuit having a delay element for oversampling a signal, the circuit comprising:

at least one data input capable of receiving an input data signal;

at least one signal input capable of receiving a clock reference signal;

the delay element comprising a delay circuit for generating delays in relation to the received clock reference signal and the received input data signal;

a first register coupled to the delay circuit for generating a first sampling of data; and a second register for generating a second sampling of data coupled to receive the clock reference signal and the input data signal, wherein the delay element comprises a plurality of delay circuits.

* * * * *